US009370098B2

(12) United States Patent
Jang et al.

(10) Patent No.: US 9,370,098 B2
(45) Date of Patent: Jun. 14, 2016

(54) PACKAGE SUBSTRATES AND INTEGRATED CIRCUIT PACKAGES INCLUDING THE SAME

(71) Applicants: Byoung Wook Jang, Hwaseong-si (KR); Jongkook Kim, Hwaseong-si (KR); Su-min Park, Ansan-si (KR)

(72) Inventors: Byoung Wook Jang, Hwaseong-si (KR); Jongkook Kim, Hwaseong-si (KR); Su-min Park, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/569,845

(22) Filed: Dec. 15, 2014

(65) Prior Publication Data

US 2015/0189750 A1    Jul. 2, 2015

(30) Foreign Application Priority Data

Jan. 2, 2014    (KR) ........................ 10-2014-0000322

(51) Int. Cl.
*H05K 1/11*    (2006.01)
*H01L 23/00*    (2006.01)
*H01L 23/498*    (2006.01)

(52) U.S. Cl.
CPC .......... *H05K 1/111* (2013.01); *H01L 23/49838* (2013.01); *H01L 24/14* (2013.01); *H01L 23/49816* (2013.01); *H01L 2224/16225* (2013.01); *H01L 2924/15311* (2013.01); *H05K 2201/094* (2013.01); *H05K 2201/09227* (2013.01); *H05K 2201/10674* (2013.01); *Y02P 70/611* (2015.11)

(58) Field of Classification Search
USPC .......................................... 257/678; 174/261
See application file for complete search history.

(56) References Cited

U.S. PATENT DOCUMENTS

| 5,615,477 | A | * | 4/1997 | Sweitzer | ........... H01L 23/49827 228/180.22 |
| 5,686,764 | A | * | 11/1997 | Fulcher | ............. H01L 23/49838 257/200 |
| 6,407,342 | B1 | | 6/2002 | Lee et al. | |
| 7,646,611 | B2 | | 1/2010 | Tani et al. | |
| 7,911,804 | B2 | | 3/2011 | Ono | |
| 8,345,436 | B2 | | 1/2013 | Kitada et al. | |
| 8,354,599 | B2 | | 1/2013 | Ebe et al. | |
| 8,574,959 | B2 | * | 11/2013 | Pendse | .................. H01L 21/563 257/734 |
| 8,587,123 | B2 | | 11/2013 | Law et al. | |
| 2007/0108613 | A1 | * | 5/2007 | Beroz | ............... H01L 23/49805 257/738 |

FOREIGN PATENT DOCUMENTS

| JP | 2007019150 | 1/2007 |
| KR | 20020023889 | 3/2002 |
| KR | 100754061 | 8/2007 |
| KR | 20090019469 | 2/2009 |
| KR | 20110131048 | 12/2011 |

* cited by examiner

*Primary Examiner* — Zandra Smith
*Assistant Examiner* — Lawrence Tynes, Jr.
(74) *Attorney, Agent, or Firm* — Myers Bigel & Sibley, P.A.

(57) ABSTRACT

Packages substrates are provided. The package substrates may include a substrate and a set of leads disposed on the substrate. The set of lead may include a first lead, a second lead and a third lead, which are sequentially disposed along a first direction. Each of the first lead, the second lead and the third lead may extend along a second direction that is different from the first direction. The first lead and the second lead may be spaced apart at a first distance, and the second lead and the third lead may be spaced apart at a second distance that is less than the first distance.

17 Claims, 5 Drawing Sheets

PACKAGE SUBSTRATES AND INTEGRATED CIRCUIT PACKAGES INCLUDING THE SAME

CROSS-REFERENCE TO RELATED APPLICATION

This U.S. non-provisional patent application claims priority under 35 U.S.C. §119 to Korean Patent Application 10-2014-0000322, filed on Jan. 2, 2014, the disclosure of which is hereby incorporated by reference in its entirety.

BACKGROUND

The present disclosure generally relates to the field of electronics and, more particularly, to integrated circuit devices.

As integrated circuit devices become slim, light, fast, versatile and highly functional, integrated circuit devices have decreased in size and a number of terminals in these devices have increased. Accordingly, research has been conducted to decrease a pitch of terminals while reducing electrical contacts between the terminals and leads disposed on package substrates.

SUMMARY

A package substrate may include a substrate including a chip area configured to receive a semiconductor chip. The package substrate may also include a first set of leads and a second set of leads disposed on the chip area of the substrate along a first direction. The first set of leads may be disposed directly adjacent to the second set of leads. The first set of leads may include a first lead, a second lead and a third lead, which are sequentially disposed along the first direction. The second set of leads may include a fourth lead, a fifth lead and a sixth lead, which are sequentially disposed along the first direction. A first spacing between the first lead and the second lead may be similar to a third spacing between the third lead and the fourth lead. A second spacing between the second lead and the third lead may be less than the first spacing and the third spacing.

In various embodiments, each of the first spacing and the third spacing may be in a range of about 15 µm to about 40 µm, and the second spacing may be in a range of about 5 µm to about 25 µm.

In various embodiments, a first width of the first lead may be greater than a second width of the second lead and a third width of the third lead, and the second width of the second lead may be similar to the third width of the third lead.

According to various embodiments, the first width of the first lead may be in a range of about 15 µm to about 40 µm, and each of the second width of the second lead and the third width of the third lead may be in a range of about 10 µm to about 30 µm.

In various embodiments, a second distance between a center of the second lead and a center of the third lead may be less than a first distance between a center of the first lead and the center of the second lead and a third distance between the center of the third lead and a center of the fourth lead. The first distance may be similar to the third distance.

According to various embodiments, a distance between a center of the first lead and a center of the fourth lead in the first direction may be in a range of about 50 µm to about 150 µm.

In various embodiments, the package substrate may further include a seventh lead on the chip area of the substrate. The seventh lead may face the first lead and may be spaced apart from the first lead in a second direction that may be substantially perpendicular to the first direction. The second lead and the third lead may extend toward the first lead in the first direction such that each of the second lead and the third lead may have a segment that is disposed between the first lead and the seventh lead.

A semiconductor package may include a package substrate including a chip area, a first set of leads and a second set of leads. The first set of leads and the second set of leads may be disposed on the chip area of the package substrate along a first direction. The first set of leads may be disposed directly adjacent to the second set of leads. The first set of leads may include a first lead, a second lead and a third lead that are sequentially disposed along the first direction, and the second set of leads may include a fourth lead, a fifth lead and a sixth lead that are sequentially disposed along the first direction. The semiconductor package may also include a semiconductor chip mounted on the chip area of the package substrate and a plurality of input/output bumps disposed on a surface of the semiconductor chip. The plurality of input/output bumps may be connected to respective end portions of the first lead, the second lead and the third lead. A first spacing between the first lead and the second lead may be similar to a third spacing between the third lead and the fourth lead, and a second spacing between the second lead and the third lead may be less than the first spacing and the third spacing.

According to various embodiments, each of the first spacing and the third spacing may be in a range of about 15 µm to about 40 µm, and the second spacing may be in a range of about 5 µm to about 25 µm.

In various embodiments, a first width of the first lead may be greater than a second width of the second lead and a third width of the third lead, and the second width of the second lead may be similar to the third width of the third lead.

In various embodiments, the first width of the first lead may be in a range of about 15 µm to about 40 µm, and each of the second width of the second and the third width of the third lead may be in a range of about 10 µm to about 30 µm.

According to various embodiments, a second distance between a center of the second lead and a center of the third lead may be less than a first distance between a center of the first lead and the center of the second lead and a third distance between the center of the third lead and a center of the fourth lead. The first distance may be similar to the third distance.

According to various embodiments, a distance between a center of the first lead and a center of the fourth lead in the first direction may be in a range of about 50 µm to about 150 µm.

In various embodiments, the semiconductor package may further include a seventh lead on the chip area of the package substrate. The seventh lead may face the first lead and may be spaced apart from the first lead in a second direction that may be substantially perpendicular to the first direction. The second lead and the third lead may extend toward the first lead in the first direction such that each of the second lead and the third lead may have a segment that is disposed between the first lead and the seventh lead. The plurality of input/output bumps may be arranged along the second direction and spaced apart from each other at a regular interval.

According to various embodiments, each of the plurality of input/output bumps may include s a connection pillar and a solder bump, and the solder bump may directly contact a corresponding one of the first lead, the second lead and the third lead.

A package substrate may include a substrate and a set of leads disposed on the substrate. The set of leads may include a first lead, a second lead and a third lead. The first lead, the second lead and the third lead may be sequentially disposed along a first direction. Each of the first lead, the second lead and the third lead may extend along a second direction that may be different from the first direction. The first lead and the second lead may be spaced apart at a first distance, and the second lead and the third lead may be spaced apart at a second distance that may be less than the first distance.

According to various embodiments, the first distance may be in a range of about 15 μm to about 40 μm, and the second distance may be in a range of about 5 μm to about 25 μm.

In various embodiments, the first lead may have a first width, the second lead may have a second width, and the third lead may have a third width. The first width may be greater than the second width and the third width.

According to various embodiments, the first width may be in a range of about 15 μm to about 40 μm, and each of the second width and the third width may be in a range of about 10 μm to about 30 μm.

In various embodiments, each of the second lead and the third lead may have a segment extending toward the first lead in the first direction.

According to various embodiments, the segments of the second lead and the third lead extending toward the first lead in the first direction may be aligned to the first lead along the second direction.

In various embodiments, the package substrate may further include a fourth lead on the substrate. The fourth lead may be spaced apart from the first lead in the second direction. The segments of the second lead and the third lead extending toward the first lead in the first direction may be disposed between the first lead and the fourth lead.

According to various embodiments, the set of leads may be a first set of leads. The package substrate may further include a second set of leads that may be disposed directly adjacent to the first set of leads in the first direction on the substrate. The second set of leads may include a fourth lead, a fifth lead and a sixth lead, which may be sequentially disposed along the first direction. Each of the fourth lead, the fifth lead and the sixth lead may extend along the second direction. The fourth lead may be spaced apart from the third lead in the first direction at a third distance that may be greater than the second distance.

In various embodiments, the third distance may be similar to the first distance.

According to various embodiments, the third distance may be in a range of about 15 μm to about 40 μm, and the second distance may be in a range of about 5 μm to about 25 μm.

In various embodiments, a fourth distance between a center of the first lead and a center of the second lead may be similar to a fifth distance between a center of third lead and a center of the fourth lead.

According to various embodiments, a distance between a center of the first lead and a center of the fourth lead in the first direction may be in a range of about 50 μm to about 150 μm.

According to various embodiments, the substrate may include a chip area, which may be configured to receive an integrated circuit device thereon. The set of leads may be disposed on the chip area.

DETAILED DESCRIPTION

Figure 1:
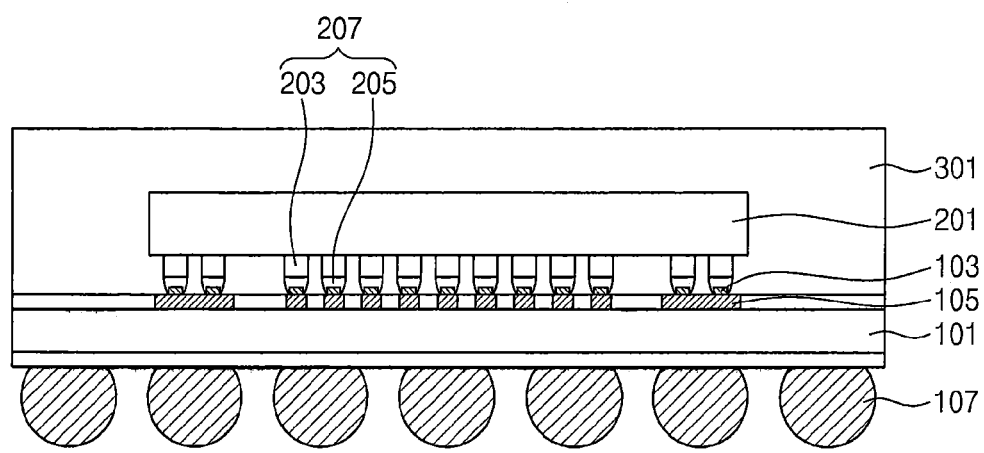
FIG. 1 is a cross-sectional view illustrating a semiconductor package according to some embodiments of the present inventive concept.

Example embodiments are described below with reference to the accompanying drawings. Many different forms and embodiments are possible without deviating from the spirit and teachings of this disclosure, and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but may include deviations in shapes.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes" and/or "including", when used in this specification, specify the presence of stated features, steps, operations, elements and/or components, but do not preclude the presence or addition of one or more other features, steps, operations, elements, components and/or groups thereof.

It will be understood that when an element is referred to as being "coupled," "connected," or "responsive" to or "on" or "adjacent" another element, it can be directly coupled, connected, or responsive to or on or adjacent the other element, or intervening elements may also be present. In contrast, when an element is referred to as being "directly coupled," "directly connected" or "directly responsive" to or "directly on" or "directly adjacent" another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Referring first to FIG. 1, a cross-sectional view illustrating a semiconductor package according to some embodiments of the present inventive concept will be discussed. As illustrated in FIG. 1, a semiconductor chip 201 may be mounted on a package substrate 101. For example, the package substrate 101 may be a printed circuit board. In particular, the package substrate 101 may be a two-layered printed circuit board formed of copper clad laminate. Leads 103 may be disposed on a first surface of the package substrate 101, and conductive pads may be placed on portions of the leads 103. The leads 103 may contact chip pads 105 of the package substrate 101. External terminals 107 may be attached onto a second surface of the package substrate 101. The first surface of the package substrate 101 may be opposite the second surface of the package substrate 101.

Bumps 207 may be formed on a surface of the semiconductor chip 201. In some embodiments, each of the bumps 207 may include a connection pillar 203 having a predetermined height and a solder bump 205 on the connection pillar 203. For example, the connection pillar 203 may be formed on the semiconductor chip 201 by photolithography and plating processes, and thereafter the solder bump 205 may be formed on the connection pillar 203 by a plating process. The connection pillar 203 may include copper.

A molding layer 301 may be formed on the semiconductor chip 201 on the package substrate 101 and to fill a space between the package substrate 101 and the semiconductor chip 201. The molding layer 301 may fill spaces between the bumps 207. In some embodiments, the molding layer 301 may completely fill the spaces between the bumps 207.

Figure 2:
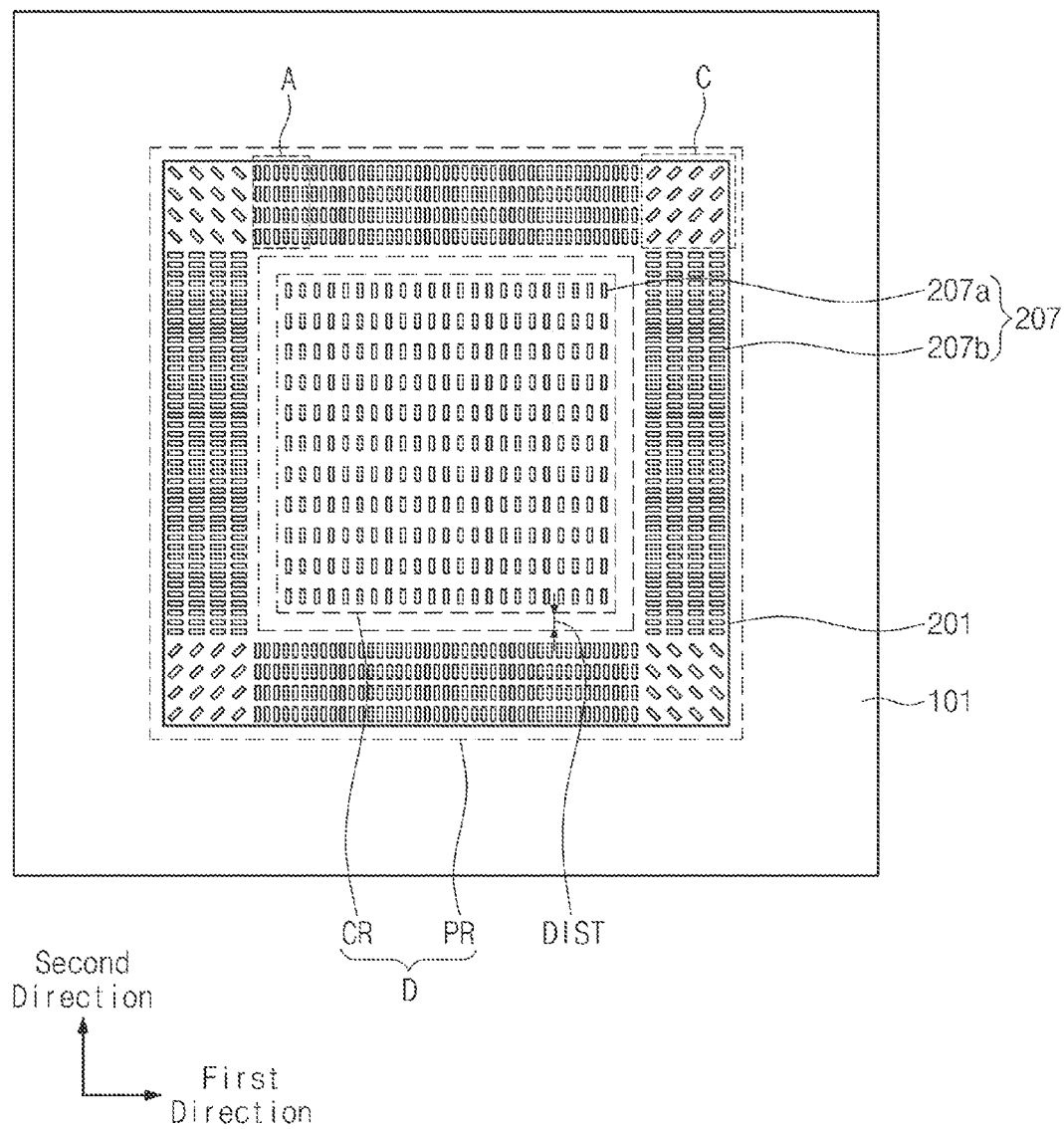
FIG. 2 is a plan view illustrating a semiconductor package according to some embodiments of the present inventive concept.

Referring now to FIG. 2, a plan view illustrating a semiconductor package according to some embodiments of the present inventive concept will be discussed. In FIG. 2, a body of a semiconductor chip 201 is represented as transparent to show arrangements of bumps 207, which are disposed under the semiconductor chip 201. As illustrated in FIG. 2, the semiconductor chip 201 may be mounted on a chip area D of a package substrate 101 in a flip-chip bonding. The bumps 207 may include reference bumps 207a and input/output bumps 207b. The reference bumps 207a may act as reference points such that the bumps 207 may attach to the conductive pads of the package substrate 101 correctly. The input/output bumps 207b may act as electrical interconnections between the package substrate 101 and the semiconductor chip 201.

The chip area D may include a central region CR and a peripheral region PR. The reference bumps 207a may be disposed on the central region CR of the chip area D, and the input/output bumps 207b may be disposed on the peripheral region PR of the chip area D. A distance DIST between the central region CR and the peripheral region PR may be about 400 µm. It will be understood that the distance DIST between the central region CR and the peripheral region PR refers a distance between edges of the central region CR and the peripheral region PR. The reference bumps 207a may be disposed along a first direction at a first interval and the input/output bumps 207b may be disposed along the first direction at a second interval that is less than the first interval. For example, the first interval may be in a range of about 100 µm to about 200 µm, and the second interval may be in a range of about 20 µm to about 70 µm. The reference bumps 207a may be disposed along a second direction at a third interval, and the input/output bumps 207b may be disposed along the second direction at a fourth interval. In some embodiments, the fourth interval may be less than the third interval. The second direction may be different from the first direction. In some embodiments, the second direction may be substantially perpendicular to the first direction.

Some input/output bumps 207b may be disposed on corners C of the peripheral region PR and may be arranged along a diagonal direction between the first direction and the second direction to reduce or possibly prevent a molding material (e.g., an epoxy resin solution) from flowing toward outside of the chip area D. Accordingly, the molding material may fill a space between the package substrate 101 and the semiconductor chip 201. In some embodiments, the molding material may completely fill the space between the package substrate 101 and the semiconductor chip 201.

Figure 3:
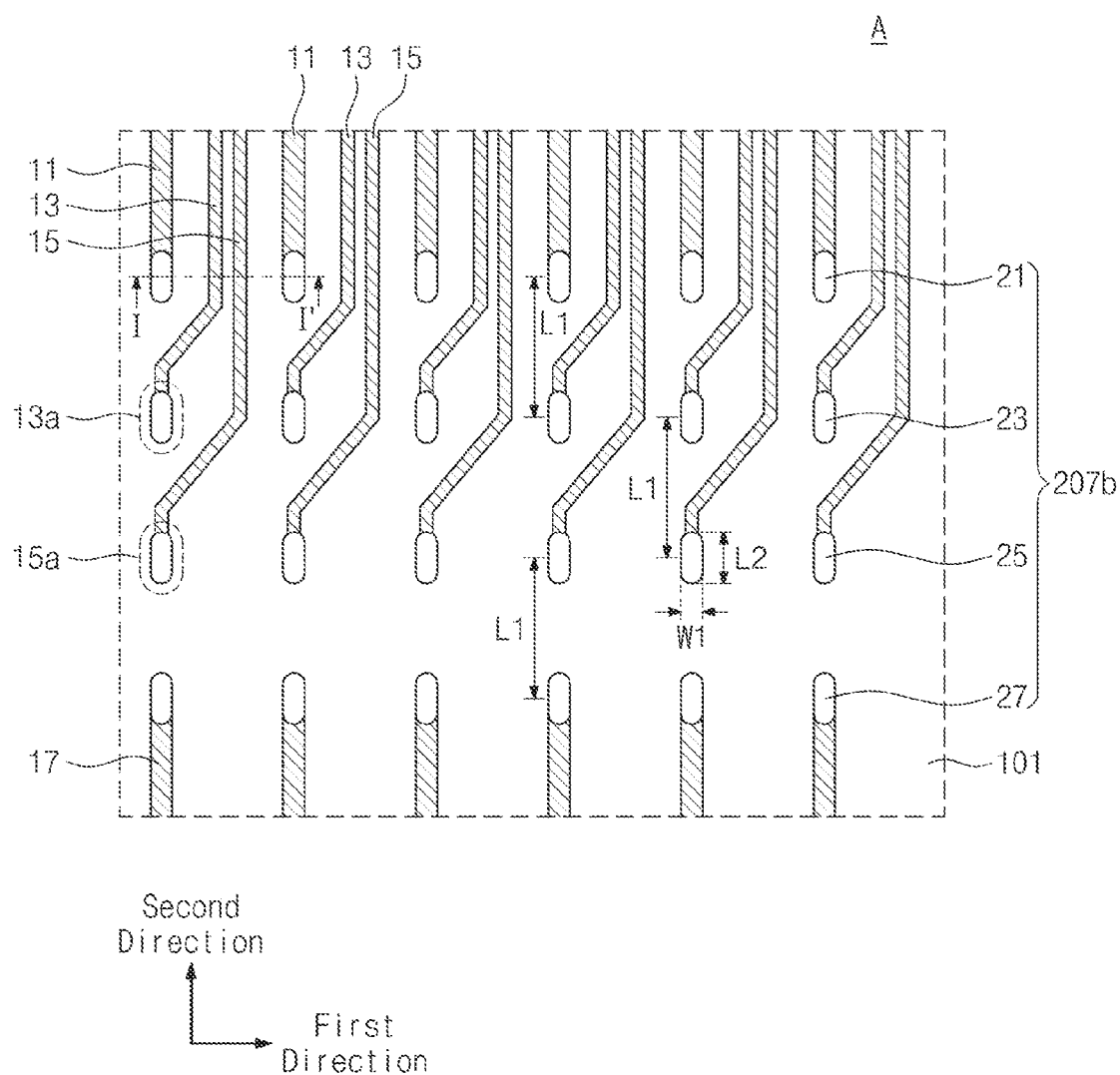
FIG. 3 is an enlarged plan view of the section "A" of FIG. 2 illustrating configurations of bumps and leads included in a semiconductor package according to some embodiments of the present inventive concept.

Referring now to FIG. 3, an enlarged plan view of the section "A" of FIG. 2 illustrating configurations of bumps and leads included in a semiconductor package according to some embodiments of the present inventive concept will be discussed. As illustrated in FIG. 3, a first lead 11, a second lead 13 and a third lead 15 may be arranged along the first direction on the package substrate 101. The first lead 11, the second lead 13 and the third lead 15 may extend in the second direction. Lengths of the first lead 11, the second lead 13 and the third lead 15 may increase from the first lead 11 to the third lead 14 such that the first lead 11 has a length shorter than lengths of the second lead 13 and the third lead 15, respectively. In some embodiments, the first lead 11, the second lead 13 and the third lead 15 may extend from a side of the package substrate 101. A fourth lead 17 may be disposed on the package substrate 101 and may extend along the second direction. The first lead 11 may face the fourth lead 17 and may be spaced apart from the fourth lead 17 in the second direction. In some embodiments, the first lead 11 and the fourth lead 17 may be aligned each other along the second direction.

As further illustrated in FIG. 3, the second lead 13 and the third lead 15 may extend toward the first lead 11 in the first direction. Specifically, the second lead 13 may have a first segment 13a extending toward the first lead 11 in the first direction, and the third lead 15 may have a second segment 15a extending toward the first lead 11 in the first direction. The first segment 13a and the second segment 15a may be disposed between the first lead 11 and the fourth lead 17. In some embodiments, the first segment 13a and the second segment 15a disposed between the first lead 11 and the fourth lead 17 may be aligned to the first lead 11 along the second direction. Each of the second lead 13 and the third lead 15 may include several segments as shown in FIG. 3.

The input/output bumps 207b may include a first input/output bump 21, a second input/output bump 23, a third input/output bump 25 and a fourth input/output bump 27. The first input/output bump 21 may contact the first lead 11, the second input/output bump 23 may contact the second lead 13, the third input/output bump 25 may contact the third lead 15, and the fourth input/output bump 27 may contact the fourth lead 17. In some embodiments, the first through the fourth input/output bumps 21, 23, 25 and 27 may contact respective end portions of the first through the fourth lead 11, 13, 15 and 17. The second input/output bump 23 and the third input/output bump 25 may be disposed between the first input/output bump 21 and the fourth input/output bump 27.

The first through the fourth input/output bumps 21, 23, 25 and 27 may be arranged along the second direction. In some embodiments, the first through the fourth input/output bumps 21, 23, 25 and 27 may be arranged in a straight line that extends in the second direction. The first through the fourth input/output bumps 21, 23, 25 and 27 may be arranged at a regular interval L1. It will be understood that the interval L1 refers to a distance between centers of two input/output bumps in the second direction as illustrated in FIG. 3. For example, the interval L1 may be in a range of from about 100 μm to about 200 μm. Each of the first through the fourth input/output bumps 21, 23, 25 and 27 may have a length L2 in the second direction, and the length L2 may be, for example, in a range of about 70 μm to about 150 μm. In some embodiments, each of the first through the fourth input/output bumps 21, 23, 25 and 27 may have a first width W1 in the first direction, and the first width W1 may be in a range of about 15 μm to about 60 μm.

It will be understood that as a pitch of the input/output bumps 207b that act as electrical interconnections decreases, a number of the input/output bumps 207b which can be disposed on a limited area of the peripheral region PR may increase. Therefore, the input/output bumps 207b may have a fine pitch and a narrow spacing to increase the number of the input/output bumps 207b in the peripheral region PR. When the input/output bumps 207b have a narrow spacing, the first through the third leads 11, 13 and 15 may also have a narrow spacing. It will be understood that the narrow spacing of the first through the third leads 11, 13 and 15 may cause electrical contact between the input/output bumps 207b and the first through the third leads 11, 13 and 15. For example, there may be a short due to electrical contact between the first input/output bump 21 and the second lead 13.

A semiconductor package substrate according to some embodiments of the present inventive concept may include the first through the third leads 11, 13 and 15 that have widths and arrangements, which allow increasing or possibly maximizing a number of the input/output bumps 207b in the peripheral region PR, thereby improving integration of the input/output bumps 207b.

As illustrated in FIG. 3, the first lead 11, the second lead 13 and the third lead 15 may be included in a first set of leads, and multiple sets of leads may be disposed along the first direction. Further, fourth leads 17 may be also disposed along the first direction. It will be understood that each set of leads may include more than three leads.

Figure 4:
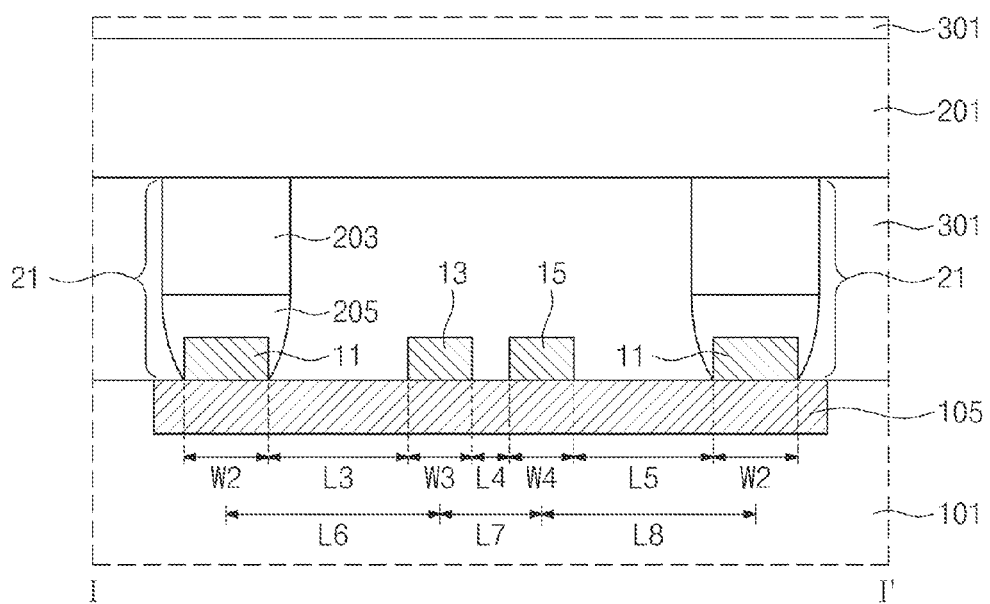
FIG. 4 is a cross-sectional view taken along the line I-I' of FIG. 3 illustrating a semiconductor package according to some embodiments of the present inventive concept.

Referring now to FIG. 4, a cross-sectional view taken along the line I-I' of FIG. 3 illustrating a semiconductor package according to some embodiments of the present inventive concept will be discussed. As illustrated in FIG. 4, the first lead 11, the second lead 13 and the third lead 15 may be formed to have a second width W2, a third width W3 and a fourth width W4, respectively. In some embodiments, the third width W3 of the second lead 13 and the fourth width W4 of the third lead 15 may be less than the second width W2 of the first lead 11. In some embodiments, the third width W3 and the fourth width W4 may be similar or substantially equivalent. For example, the second width W2 of the first lead 11 may be in a range of about 15 μm to about 40 μm, and each of the third width W3 of the second lead 13 and the fourth width W4 of the third lead 15 may be in a range of about 10 μm to about 30 μm.

Within one set of leads, a first spacing L3 may be provided between the first lead 11 and the second lead 13, and a second spacing L4 may be provided between the second lead 13 and the third lead 15. A third spacing L5 may be provided between the third lead 15 and a first lead 11 of another set of leads that is disposed directly adjacent to the one set of leads along the first direction. It will be understood that the term "spacing" refers to a distance between sides of two leads as illustrated in FIG. 4. The first spacing L3, the second spacing L4 and the third spacing L5 may be different each other. In some embodiments, the first spacing L3 and the third spacing L5 may be greater than the second spacing L4, and the first spacing L3 and the third spacing L5 may be similar or substantially equivalent. For example, the first spacing L3 may be in a range of about 15 μm to about 40 μm. The first spacing L3 may be a minimum distance that is necessary to separate the second lead 13 from the first input/output bump 21 contacting the first lead 11. The second spacing L4 may be in a range of about 5 μm to about 25 μm. The third spacing L5 may be in a range of about 15 μm to about 40 μm. The third spacing L5 may be a minimum distance that is necessary to separate the third lead 15 from the first input/output bump 21 contacting the first lead 11.

Still referring to FIG. 4, a second distance L7 between a center of the second lead 13 and a center of the third lead 15 may be less than a first distance L6 between a center of the first lead 11 and the center of the second lead 15 and a third distance L8 between the center of the third lead 15 and a center of the first lead 11 that is disposed next to the third lead 15. It will be understood that each of the first distance L6, the second distance L7 and the third distance L8 is a distance along the first direction. A distance between the centers of two first leads 11 along the first direction may be L6+L7+L8 and may be in a range of about 50 μm to about 150 μm. It will be further understood that a phrase "a center of a lead" refers a center of a lead in the first direction as illustrated in FIG. 4.

The second spacing L4, the third width W3 of the second lead 13 and the fourth width W4 of the third lead 15 may decrease to increase the first spacing L3 and the third spacing L5. Accordingly, the possibility of an electrical short between the first input/output bump 21 and the second lead 13 or between the third lead 15 and the first input/output bump 21 may be reduced or possibly prevented. According to some embodiments of the present inventive concept, when the first spacing L3 or the third spacing L5 increases, the distance between the centers of two first leads 11, L6+L7+L8, may decrease. Therefore, a number of the input/output bumps 207b disposed in the peripheral region PR of the chip area D may increase such that reliability and electrical characteristics of a semiconductor package may be improved.

Figure 5:
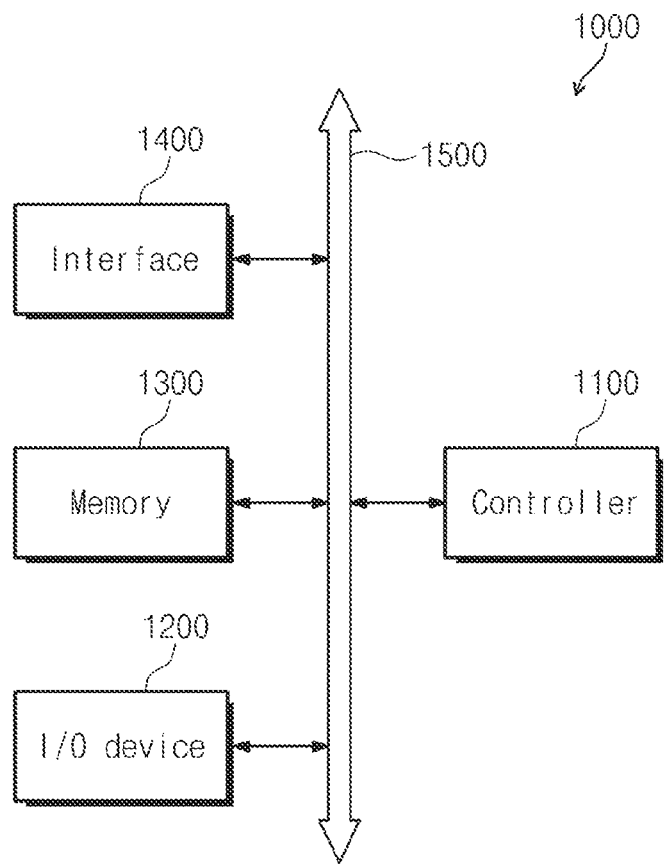
FIG. 5 is a schematic block diagram illustrating an electronic system including a semiconductor package according to some embodiments of the present inventive concept.
Figure 6:
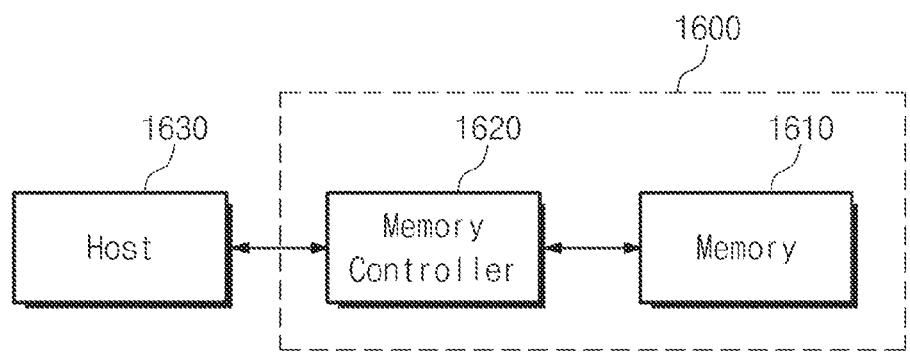
FIG. 6 is a schematic block diagram illustrating a memory system including a semiconductor package according to some embodiments of the present inventive concept.

FIG. 5 is a schematic block diagram illustrating an electronic system including a semiconductor package according to some embodiments of the present inventive concept. FIG. 6 is a schematic block diagram illustrating a memory system including a semiconductor package according to some embodiments of the present inventive concept.

Referring to FIG. 5, an electronic system 1000 may include a controller 1100, an input/output (I/O) device 1200, and a memory 1300. The controller 1100, the I/O device 1200, and the memory 1300 may be connected to each other through a bus 1500. The bus 1500 may correspond to a data transfer path. The controller 1100 may include at least one of a microprocessor, a digital signal processor, a microcontroller, and other logic devices capable of performing similar functions thereto. The controller 1100 and the memory 1300 may include a semiconductor package according to some embodiments of the present inventive concept. The I/O device 1200 may include, for example, a keypad, a keyboard or a display device. The memory 1300 may store data and/or commands executed by the controller 1100. The memory 1300 may include a volatile memory device and/or a nonvolatile memory device. In some embodiments, the memory 1300 may be a flash memory device. For example, a flash memory device according to some embodiments may be mounted on an information processing system such as a mobile device or desktop computer. For example, the flash memory device may be a solid state disk (SSD). In this case, the electronic system 1000 can store large amounts of data in the flash memory device. The electronic system 1000 may further include an interface 1400 to communicate data with a communication network. The interface 1400 may be wired or wireless. For example, the interface 1140 may include antennas, wire/wireless transceivers, etc. It will be understood that the electronic system 1000 may further include an application chipset, a camera image processor (CIS) and/or an input/output device.

The electronic system 1000 may be a mobile system, a personal computer, an industrial computer, or system carrying out various functions. For example, the mobile system may be a personal digital assistant (PDA), a portable computer, a web-tablet, a mobile phone, a wireless phone, a laptop computer, a memory card, a digital music system, or an information transmitting/receiving system. The electronic system 1000 may be used in a wireless communication system using an interface protocol such as CDMA, GSM, NADC, E-TDMA, WCDAM, and CDMA1000.

Referring now to FIG. 6, a memory card 1600 may include a nonvolatile memory device 1610 and a memory controller 1620. The nonvolatile memory device 1610 may store data, and the memory controller 1620 may read stored data. The nonvolatile memory device 1610 may include a semiconductor package according to some embodiments of the present inventive concept. The memory controller 1620 may read stored data and control to store data in the nonvolatile memory device 1610 in response to a read/write request of a host 1630.

According to some embodiments of the present inventive concept, input/output bumps of a chip contacting leads that are disposed on a package substrate may be arranged to have a small pitch and to reduce or possibly prevent the occurrence of electrical shorts between the input/output bumps and the leads. Widths and/or arrangement of the leads may be determined to reduce the occurrence of electrical shorts between the input/output bumps and the leads. Thus, a number of the input/output bumps disposed on a limited area of the package substrate may increase, thereby reducing fabrication cost of the package substrate and improving reliability and electrical characteristics of the semiconductor package.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents and shall not be restricted or limited by the foregoing detailed description.

What is claimed is:

1. A package substrate comprising:
a substrate including a chip area configured to receive a semiconductor chip;
a first set of leads and a second set of leads disposed on the chip area of the substrate along a first direction, wherein:
the first set of leads is disposed directly adjacent to the second set of leads;
the first set of leads includes a first lead, a second lead and a third lead, which are sequentially disposed along the first direction;
the second set of leads includes a fourth lead, a fifth lead and a sixth lead, which are sequentially disposed along the first direction;
a first spacing between the first lead and the second lead is similar to a third spacing between the third lead and the fourth lead; and
a second spacing between the second lead and the third lead is less than the first spacing and the third spacing; and
a seventh lead on the chip area of the substrate, wherein:
the seventh lead faces the first lead and is spaced apart from the first lead in a second direction that is substantially perpendicular to the first direction; and
the second lead and the third lead extend toward the first lead in the first direction such that each of the second lead and the third lead has a segment that is disposed between the first lead and the seventh lead.

2. The package substrate of claim 1, wherein each of the first spacing and the third spacing is in a range of about 15 μm to about 40 μm, and the second spacing is in a range of about 5 μm to about 25 μm.

3. The package substrate of claim 1, wherein a first width of the first lead is greater than a second width of the second lead and a third width of the third lead, and the second width of the second lead is similar to the third width of the third lead.

4. The package substrate of claim 3, wherein the first width of the first lead is in a range of about 15 μm to about 40 μm, and each of the second width of the second lead and the third width of the third lead is in a range of about 10 μm to about 30 μm.

5. The package substrate of claim 1:
wherein a second distance between a center of the second lead and a center of the third lead is less than a first distance between a center of the first lead and the center of the second lead and a third distance between the center of the third lead and a center of the fourth lead; and
wherein the first distance is similar to the third distance.

6. The package substrate of claim 1, wherein a distance between a center of the first lead and a center of the fourth lead in the first direction is in a range of about 50 μm to about 150 μm.

7. A package substrate, the package substrate comprising:
a substrate;
a set of leads disposed on the substrate:
wherein the set of leads comprises a first lead, a second lead and a third lead, the first lead, the second lead and the third lead being sequentially disposed along a first direction;
wherein each of the first lead, the second lead and the third lead extends along a second direction that is different from the first direction;
wherein the first lead and the second lead are spaced apart at a first distance, and the second lead and the third lead are spaced apart at a second distance that is less than the first distance; and wherein each of the second lead and the third lead has a segment extending toward the first lead in the first direction; and a fourth lead on the substrate:
wherein the fourth lead is spaced apart from the first lead in the second direction; and
wherein the segments of the second lead and the third lead extending toward the first lead in the first direction are disposed between the first lead and the fourth lead.

8. The package substrate of claim 7:
wherein the first distance is in a range of about 15 µm to about 40 µm; and
wherein the second distance is in a range of about 5 µm to about 25 µm.

9. The package substrate of claim 7:
wherein the first lead has a first width, the second lead has a second width, and the third lead has a third width; and
wherein the first width is greater than the second width and the third width.

10. The package substrate of claim 9:
wherein the first width is in a range of about 15 µm to about 40 µm; and
wherein each of the second width and the third width is in a range of about 10 µm to about 30 µm.

11. The package substrate of claim 7, wherein the segments of the second lead and the third lead extending toward the first lead in the first direction are aligned to the first lead along the second direction.

12. The package substrate of claim 7:
wherein the set of leads is a first set of leads;
wherein the package substrate further comprises a second set of leads that is disposed directly adjacent to the first set of leads in the first direction on the substrate;
wherein the second set of leads comprises a fifth lead, a sixth lead and a seventh lead, which are sequentially disposed along the first direction;
wherein each of the fifth lead, the sixth lead and the seventh lead extends along the second direction; and
wherein the fifth lead is spaced apart from the third lead in the first direction at a third distance that is greater than the second distance.

13. The package substrate of claim 12, wherein the third distance is similar to the first distance.

14. The package substrate of claim 13:
wherein the third distance is in a range of about 15 µm to about 40 µm; and
wherein the second distance is in a range of about 5 µm to about 25 µm.

15. The package substrate of claim 12, wherein a fourth distance between a center of the first lead and a center of the second lead is similar to a fifth distance between a center of third lead and a center of the fifth lead.

16. The package substrate of claim 12, wherein a distance between a center of the first lead and a center of the fifth lead in the first direction is in a range of about 50 µm to about 150 µm.

17. The package substrate of claim 7:
wherein the substrate comprises a chip area, which is configured to receive an integrated circuit device thereon; and
wherein the set of leads is disposed on the chip area.

* * * * *